US008933827B2

(12) United States Patent
Okayama

(10) Patent No.: US 8,933,827 B2
(45) Date of Patent: Jan. 13, 2015

(54) DATA PROCESSING APPARATUS THAT ENABLES IMPORT/EXPORT OF SETTING VALUE, CONTROL METHOD THEREFOR, AND STORAGE MEDIUM STORING CONTROL PROGRAM THEREFOR

(71) Applicant: Canon Kabushiki Kaisha, Tokyo (JP)

(72) Inventor: Noritsugu Okayama, Kawasaki (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/901,685

(22) Filed: May 24, 2013

(65) Prior Publication Data

US 2013/0314259 A1 Nov. 28, 2013

(30) Foreign Application Priority Data

May 28, 2012 (JP) ................. 2012-120583

(51) Int. Cl.
*H03M 5/00* (2006.01)
*H03M 7/00* (2006.01)
*G06F 17/22* (2006.01)

(52) U.S. Cl.
CPC ............. *H03M 7/00* (2013.01); *G06F 17/2217* (2013.01)
USPC ............. 341/55; 715/236; 715/264; 715/259; 715/258; 715/703; 704/2; 704/5; 704/7; 704/9; 717/126; 717/124; 717/120; 717/141; 717/154; 341/70; 341/90

(58) Field of Classification Search
CPC ........... H03M 7/00; H03M 7/30; G06F 12/00; G06F 17/22; G06F 17/30; G06F 17/214; G06F 17/2217; G06F 17/2223; G06F 17/2264; G06F 3/12; B41J 5/44; B41J 29/38; H04N 1/00; H04L 29/06
USPC ............. 341/50–90; 715/236, 264, 259, 258, 715/703; 704/2–9; 707/101, 104.1; 717/126, 124, 120, 141, 154
See application file for complete search history.

(56) References Cited

U.S. PATENT DOCUMENTS

| | | | | |
|---|---|---|---|---|
| 5,682,158 A * | 10/1997 | Edberg et al. | .................... | 341/90 |
| 6,204,782 B1 * | 3/2001 | Gonzalez et al. | ............... | 341/90 |
| 6,400,287 B1 * | 6/2002 | Ehrman | .......................... | 341/55 |
| 6,556,713 B2 * | 4/2003 | Kobayashi et al. | ........... | 382/224 |
| 7,020,602 B1 * | 3/2006 | Kim et al. | ......................... | 704/8 |
| 7,051,278 B1 * | 5/2006 | Ehrman | ....................... | 715/264 |
| 7,154,538 B1 * | 12/2006 | Fukasawa et al. | ............. | 348/211.3 |
| 7,162,712 B2 * | 1/2007 | Shaylor et al. | ................. | 717/114 |
| 7,199,729 B2 * | 4/2007 | Chen et al. | ..................... | 341/50 |
| 7,251,667 B2 * | 7/2007 | Atkin | ..................... | 707/999.104 |
| 7,278,100 B1 * | 10/2007 | Ehrman | ........................ | 715/264 |
| 7,779,391 B2 * | 8/2010 | Greiner | ......................... | 717/126 |

FOREIGN PATENT DOCUMENTS

JP 2000-207392 A 7/2000

* cited by examiner

*Primary Examiner* — Lam T Mai
(74) *Attorney, Agent, or Firm* — Rossi, Kimms & McDowell LLP

(57) ABSTRACT

A data processing apparatus that is capable of reducing the garbling of characters caused by the difference among the character codes when setting data are transferred to another apparatus by the import-export function. A storage unit stores setting data for the data processing apparatus. A receiving unit receives an instruction for exporting the setting data stored in the storage unit. A converting unit converts Unicode data included in the setting data into character code data of language, which is set to the data processing apparatus. An export unit exports the character code data converted by the converting unit and the Unicode data.

6 Claims, 13 Drawing Sheets

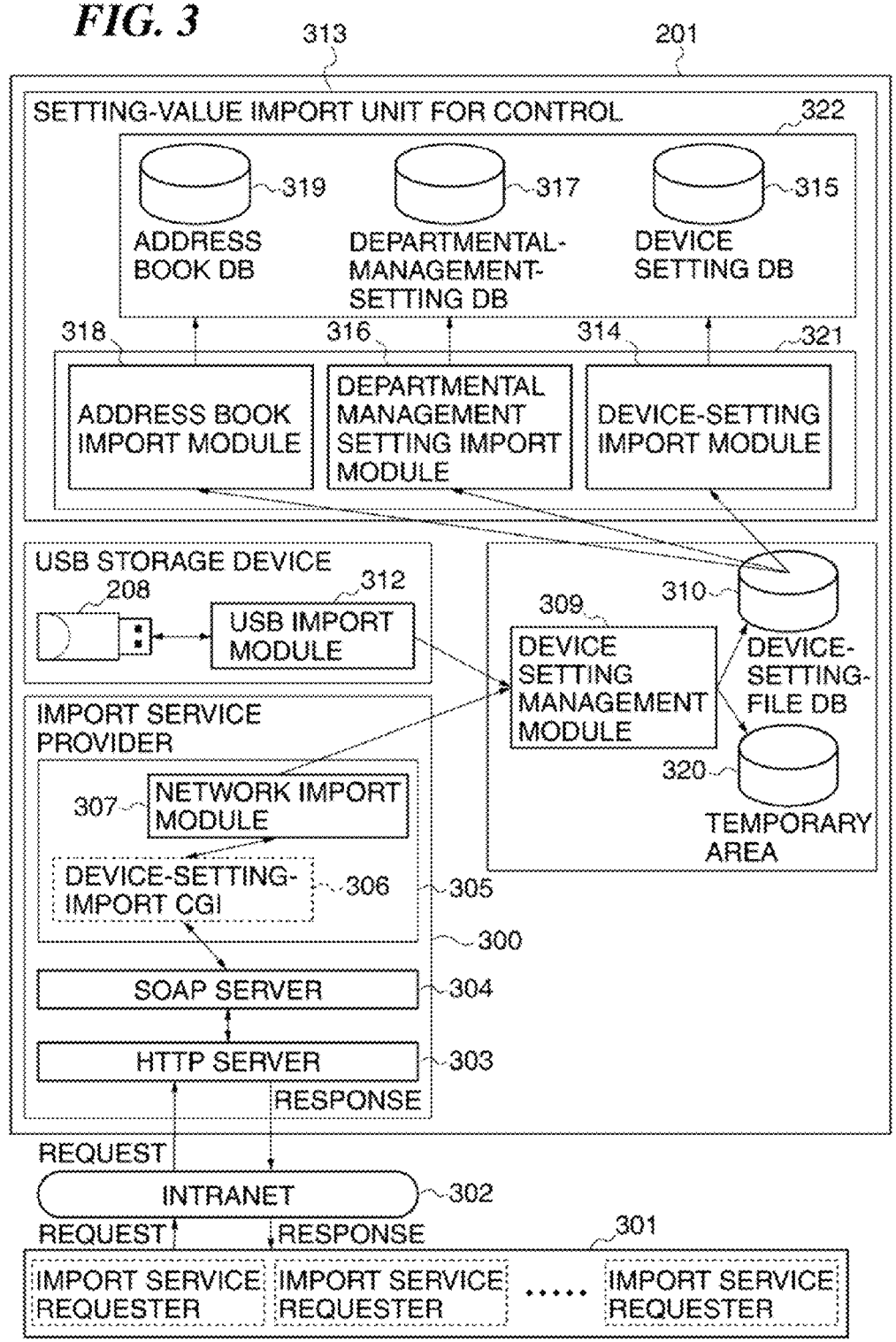

FIG.4

| SettingDataName | KeyName | Type | Size (bytes) | Value | ConversionFlag |
|---|---|---|---|---|---|
| DEVICE NAME | device_name | string | 16 | | 1 |
| DEVICE NAME | device_name_utf8 | string | 32 | X'695243E4B880E58FB7E6A99F' | 1 |
| DEVICE LOCATION | device_location | string | 16 | | 1 |
| DEVICE LOCATION | device_location_utf8 | string | 32 | X'3332E5AE9FE9A893E5AEA4' | 1 |
| SUMMERTIME SETTING | summer_time_settings | binary | 44 | X'2E76BC33···' | 0 |
| AUTO CLEAR TIME | auto_clear_time | int | 4 | 120 | 0 |
| FAX RECEPTION MODE | fax_receive_mode | u16 | 2 | 1 | 0 |
| ····· | | | | | |

FIG.5

```xml
<?xml version="1.0" encoding="utf-8" ?>
<lang>jp</lang>
<device_settings>
<device_name_utf8 size="32" type="string" >X'695243E4b880E58FB7E6A99F'</device_name_utf8>
<device_name size="16" type="string" >X'69524388EA8D868B40'</device_name>
<device_location_utf8size="32" type="string" >X'3332E5AE9FE9A893E5AEA4'</device_location_utf8>
<device_location size="16" type="string" >X'33328EC08CB18EBA'</device_location>
<summer_time_settings size="44" type="binary" >X'2E76BC33F8A0'</summer_time_settings>
<auto_clear_time size="4" type="int" >120</auto_clear_time>
<fax_receive_mode size="2" type="u16" >1</fax_receive_mode>
......
</device_settings>
```

*FIG.6*

| LANGUAGE SETTING(lang) | FIRST CHARACTER CODE | SECOND CHARACTER CODE |
|---|---|---|
| JAPANESE(jp) | UTF-8 | Shift-JIS |
| ENGLISH(en) | UTF-8 | WCP1252 |
| TAIWANESE(tw) | UTF-8 | BIG5 |
| ...... | | |
| ...... | | |

*FIG.8*

| SettingDataName | KeyName | Type | Size (bytes) | Value | Conversion Flag |
|---|---|---|---|---|---|
| DEVICE NAME | device_name | string | 16 | | 1 |
| DEVICE NAME | device_name_utf8 | string | 32 | | 1 |
| DEVICE LOCATION | device_location | string | 16 | | 1 |
| DEVICE LOCATION | device_location_utf8 | string | 32 | | 1 |
| AUTO CLEAR TIME | auto_clear_time | int | 4 | | 0 |
| FAX RECEPTION MODE | fax_receive_mode | u16 | 2 | | 0 |
| ..... | ..... | | | | |
| ..... | ..... | | | | |

FIG.10

```
<?xml version="1.0" encoding="utf-8" ?>
<lang>jp</lang>
<device_settings>
    <device_name_utf8 size="32" type="string" >X'695243E4b880E58FB7E6A99F'</device_name_utf8>
    <device_name size="16" type="string" >X'6952438EA8D868B40'</device_name>
    <device_location size="16" type="string" >X'33328EC08CB18EBA'</device_location>
    <summer_time_settings size="44" type="binary" >X'2E76BC33F8A0'</summer_time_settings>
    <auto_clear_time size="4" type="int" >120</auto_clear_time>
    ......
</device_settings>
```

FIG.11

| SettingDataName | KeyName | Type | Size (bytes) | Value | Conversion Flag |
|---|---|---|---|---|---|
| DEVICE NAME | device_name | string | 16 | X'695243E4B880E58FB7E6A99F' | 1 |
| DEVICE NAME | device_name_utf8 | string | 32 | X'695243E4B880E58FB7E6A99F' | 1 |
| DEVICE LOCATION | device_location | string | 16 | | 1 |
| DEVICE LOCATION | device_location_utf8 | string | 32 | X'3332E5AE9FE9A893E5AEA4' | 1 |
| AUTO CLEAR TIME | auto_clear_time | int | 4 | 120 | 0 |
| FAX RECEPTION MODE | fax_receive_mode | u16 | 2 | | 0 |
| ...... | ...... | | | | |

*FIG. 12A*

[SETTING OF DEVICE INFORMATION]

DEVICE NAME *

LOCATION *

CANCEL          OK

SYSTEM STATUS/ABORT

*FIG. 12B*

[SETTING OF DEVICE INFORMATION]

DEVICE NAME * | iRC No. 1

LOCATION * | LABORATORY No. 32

CANCEL          OK

SYSTEM STATUS/ABORT

*FIG.13A*

| SettingDataName | KeyName | Type | Size (bytes) | Value | Conversion Flag |
|---|---|---|---|---|---|
| DEVICE NAME | device_name | string | 16 | | 0 |
| DEVICE LOCATION | device_location | string | 16 | | 0 |
| AUTO CLEAR TIME | auto_clear_time | int | 4 | | 0 |
| FAX RECEPTION MODE | fax_receive_mode | u16 | 2 | | 0 |
| ... | | | | | |

*FIG.13B*

| SettingDataName | KeyName | Type | Size (bytes) | Value | Conversion Flag |
|---|---|---|---|---|---|
| DEVICE NAME | device_name | string | 16 | X'69524388EA8D868B40' | 0 |
| DEVICE LOCATION | device_location | string | 16 | X'33328EC08CB18EBA' | 0 |
| AUTO CLEAR TIME | auto_clear_time | int | 4 | 120 | 0 |
| FAX RECEPTION MODE | fax_receive_mode | u16 | 2 | | 0 |
| ... | | | | | |

DATA PROCESSING APPARATUS THAT ENABLES IMPORT/EXPORT OF SETTING VALUE, CONTROL METHOD THEREFOR, AND STORAGE MEDIUM STORING CONTROL PROGRAM THEREFOR

BACKGROUND OF THE INVENTION

1. Field of the Invention

The present invention relates to a data processing apparatus that enables import/export of a setting value, a control method therefor, and a storage medium storing control program therefor.

2. Description of the Related Art

Image forming apparatuses, such as copying machines and facsimile machines, in recent years have many user set items with high performance, and tend to increase time and effort of a user who registers setting values (setting data) for the user set items. Accordingly, there is an apparatus that is provided with an import-export function that enables to bring setting data of a certain apparatus out and to register the setting data to another apparatus of the same kind or a different kind as a technique that simplifies registration of a series of setting values.

However, an import-export function of a conventional image forming apparatus did not consider a case where character codes are different among image forming apparatuses. Accordingly, import of character string data of a character code that is not supported by an import image forming apparatus causes a problem that the characters are not displayed correctly due to garbling.

On the other hand, there is a technique that converts a character code in order to absorb the difference among the character codes supported by different apparatuses. For example, Japanese Laid-Open Patent Publication (Kokai) No. 2000-207392 (JP 2000-207392A) proposes a technique that converts document data in a character code of a host into data in a character code of a printer, reads fonts corresponding to the converted data from a memory, and outputs the fonts to the printer.

SUMMARY OF THE INVENTION

The present invention provides a data processing apparatus, a control method therefor, and a storage medium storing a control program therefor, which are capable of reducing the garbling of characters caused by the difference among the character codes when setting data are transferred to another apparatus by the import-export function.

Accordingly, a first aspect of the present invention provides a data processing apparatus comprising a storage unit configured to store setting data for the data processing apparatus, a receiving unit configured to receive an instruction for exporting the setting data stored in the storage unit, a converting unit configured to convert Unicode data included in the setting data into character code data of language, which is set to the data processing apparatus, and an export unit configured to export the character code data converted by the converting unit and the Unicode data.

Accordingly, a second aspect of the present invention provides a data processing apparatus comprising a store storage unit configured to store setting data for the data processing apparatus, a receiving unit configured to receive an instruction for importing setting data of the data processing apparatus, a converting unit configured to convert character code data included in the setting data that is not Unicode data into Unicode data, and an import unit configured to import the Unicode data converted by the converting unit when the setting data imported according to an instruction received by the receiving unit is not Unicode data, and to import data without conversion by the converting unit when the setting data imported according to the instruction is Unicode data.

Accordingly, a third aspect of the present invention provides a control method for a data processing apparatus comprising storing setting data for the data processing apparatus, receiving an instruction for exporting the stored setting data, converting Unicode data included in the setting data into character code data of language, which is set to the data processing apparatus, and exporting the character code data converted in the converting and the Unicode data.

Accordingly, a fourth aspect of the present invention provides a control method for a data processing apparatus comprising storing setting data for the data processing apparatus, receiving an instruction for importing setting data for the data processing apparatus, converting character code data included in the setting data that is not Unicode data into Unicode data, and importing the Unicode data converted by the converting when the setting data imported according to an instruction received in the receiving is not Unicode data, and importing data without converting when the setting data imported according to the instruction is Unicode data.

Accordingly, a fifth aspect of the present invention provides a non-transitory computer-readable storage medium storing a computer-readable program and the program computer executable codes to perform the control method according to the third aspect.

Accordingly, a sixth aspect of the present invention provides a non-transitory computer-readable storage medium storing a computer-readable program and the program computer executable codes to perform the control method according to the fourth aspect.

The present invention is capable of reducing the garbling of characters caused by the difference among the character codes when setting data is transferred to another apparatus by the import-export function.

Further features of the present invention will become apparent from the following description of exemplary embodiments with reference to the attached drawings.

BRIEF DESCRIPTION OF THE DRAWINGS

FIG. 3 is a block diagram schematically showing a functional configuration of an image forming apparatus in a group of managed object apparatuses shown in FIG. 1.

FIG. 4 is a view showing an example of setting data read from a device setting file database (DB) by a device setting management module shown in FIG. 3.

FIG. 5 is a view showing an example of a device setting file generated by the device setting management module shown in FIG. 3.

FIG. 6 is a view showing a language setting of the image forming apparatus shown in FIG. 2.

FIG. 8 is a view showing contents of the device setting file DB initialized by the device setting management module.

FIG. 10 is a view showing an example of a device setting file.

FIG. 11 is a view showing contents of the device-setting-file DB after the registration process shown in FIG. 10.

FIG. 12A is a view showing a screen before import displayed on an LCD panel shown in FIG. 2.

FIG. 12B is a view showing a screen after the import displayed on the LCD panel shown in FIG. 2.

FIG. 13A is a view showing contents of the device-setting-file DB before registering the contents of the device setting file shown in FIG. 10 into an image forming apparatus that employs a different character code.

FIG. 13B is a view showing contents of the device-setting-file DB after registering the contents of the device setting file shown in FIG. 10 into the image forming apparatus that employs the different character code.

DESCRIPTION OF THE EMBODIMENTS

Hereafter, embodiments according to the present invention will be described in detail with reference to the drawings.

Figure 1:
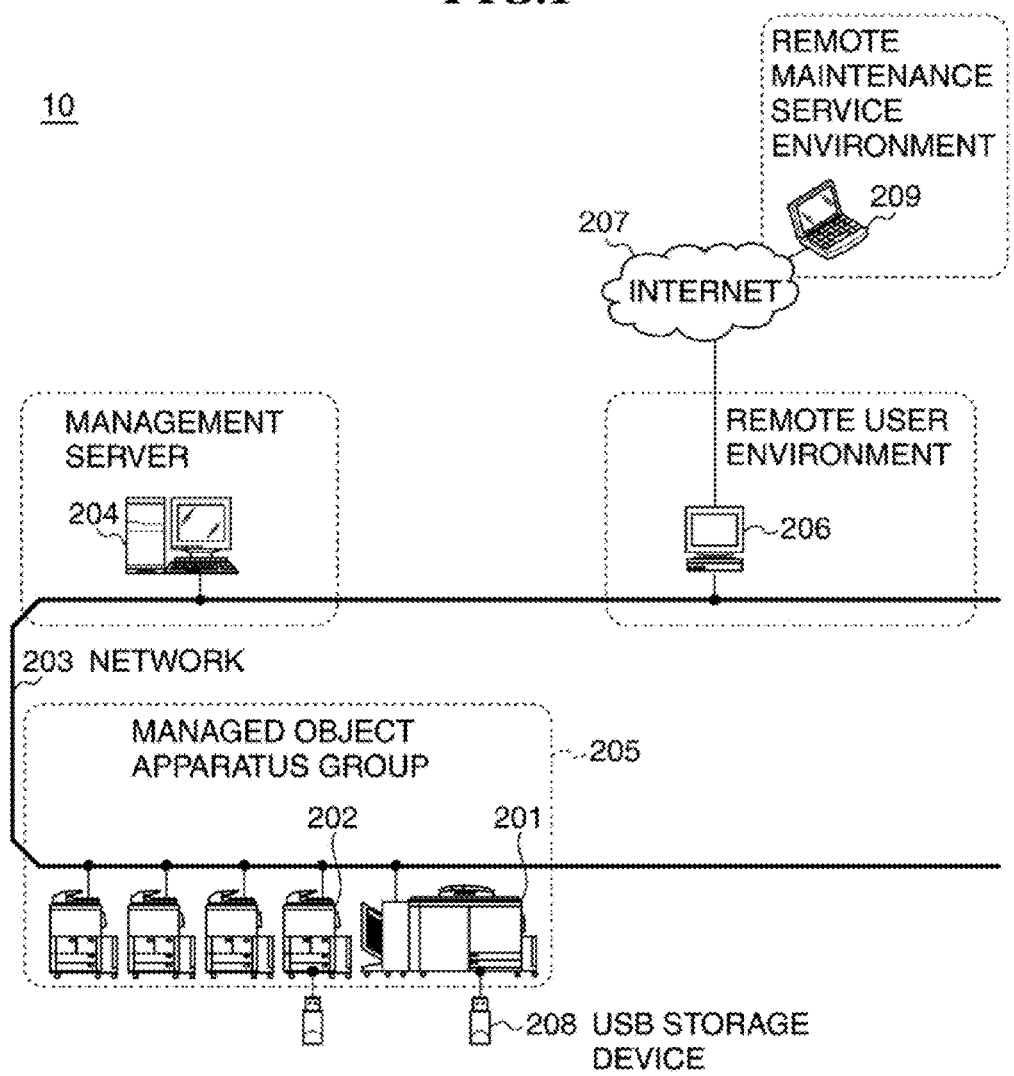
FIG. 1 is a view showing a setting value management system that includes an image forming apparatus according to the embodiment.

FIG. 1 is a view showing a setting value management system 10 that includes an image forming apparatus according to the embodiment.

As shown in FIG. 1, the setting value management system 10 consists of a management server 204, terminals 206 and 209, and a managed object apparatus group 205 that contains a plurality of image forming apparatuses (five sets in FIG. 1). Each of the image forming apparatuses of the managed object apparatus group 205, the management server 204, and the terminal 206 are connected to a network 203. Moreover, the terminal 206 and the terminal 209 are connected to the Internet 207. Furthermore, image forming apparatuses 201 and 202 are selected from among the various image forming apparatuses for description. An image forming apparatus is an example of a data processing apparatus.

The image forming apparatuses 201 and 202 read originals and form images thereof on recording sheets etc.

Moreover, the image forming apparatuses 201 and 202 can receive image data read by another image forming apparatus and PDL data generated by a client computer (not shown) via the network 203 and can output them.

Furthermore, the image data read by the image forming apparatus 201 or 202 can be transmitted to various apparatuses, such as a file server and a mail server that are not shown through the network 203.

The management server 204 is connected with the image forming apparatuses of the managed object apparatus group 205 through the network 203, and communicates to export and import setting values. Well-known protocols, such as HTTP (Hyper Text Transfer Protocol), SOAP (Simple Object Access Protocol), and FTP (File Transfer Protocol), are used for this communication.

The terminal 206 in remote user environment has the same function as the management server 204, and is connected with the terminal 209 in remote maintenance service environment through the Internet 207 as mentioned above.

Thereby, the terminal 209 operates the terminal 206 in the remote user environment so as to make the image forming apparatus of the managed object apparatus group 205 export the setting values to store them, and so as to import the setting values that are stored in the terminal 206.

Moreover, the image forming apparatuses 201 and 202 export the setting data to a USB storage device 208 according to a user's operation without using the managing server 204, and import the setting data that is stored in the USB storage device 208.

Figure 2:
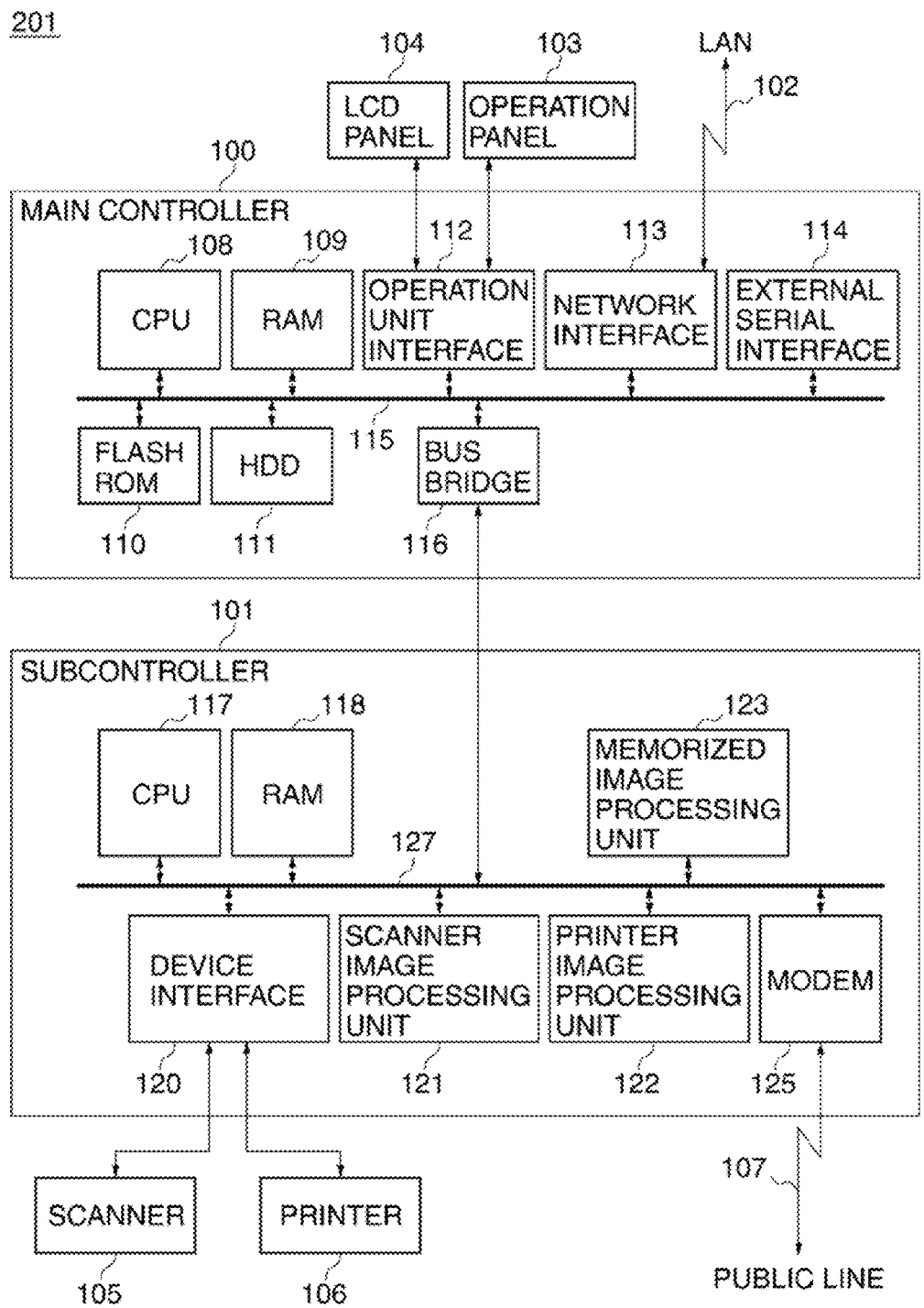
FIG. 2 is a block diagram schematically showing a configuration of the image forming apparatus shown in FIG. 1.

FIG. 2 is a block diagram schematically showing a configuration of the image forming apparatus 201 shown in FIG. 1. The image forming apparatus 201 will be described as the representative of the managed object apparatus group 205. The configuration described in FIG. 2 is common to the image forming apparatuses of the managed object apparatus group 205.

As shown in FIG. 2, the image forming apparatus 201 consists of a main controller 100, a subcontroller 101, an operation panel 103, an LCD panel 104, a scanner 105, and a printer 106.

The main controller 100 consists of a CPU 108, a RAM 109, an operation unit interface 112, a network interface 113, an external serial interface 114, a flash ROM 110, an HDD 111, and a bus bridge 116. These are connected via a system bus 115.

The CPU 108 controls the entire main controller 100. The RAM 109 is used as a main memory and a work area of the CPU 108, and stores image data. The operation unit interface 112 is an interface between the main controller 100 and an operation unit that consists of the LCD panel 104 and the operation panel 103. The LCD panel 104 is united with a touch panel. The LCD panel 104 displays information to a user. The touch panel allows a user to operate. Moreover, the operation panel 103 consists of hard buttons, such as a ten key pad and a start key.

The network interface 113 is an NIC, for example, and is an interface between the main controller 100 and a LAN 102. Thereby, the image forming apparatus 201 exchanges data bidirectionally with another networking device or a file server through the LAN 102.

In the embodiment, the external serial interface 114 is a USB interface to which an external device, such as a memory-media reader or an IC card reader, is connected to exchange data bidirectionally.

In the embodiment, a device setting file is exchanged through the network interface 113 or the external serial interface 114 at the time of import and export.

The flash ROM 110 and the HDD 111 stores image data, the setting values of the image forming apparatus 201, and programs that are executed by the CPU 108. In the embodiment, the data of setting values that is imported and exported is stored in the HDD 111.

The bus bridge 116 connects the buses of the main controller 100 and the subcontroller 101.

The subcontroller 101 consists of a CPU 117, a RAM 118, a memorized image processing unit 123, a device interface 120, a scanner image processing unit 121, a printer image processing unit 122, and a modem 125. These are connected via a system bus 127.

The CPU 117 controls the entire subcontroller 101. The RAM 118 is used as a main memory and a work area of the CPU 117, and stores image data.

The memorized image processing unit 123 applies an image process to image data stored in the RAM 118, and stores again the processed image data into the RAM 118. The image process includes rotation, scaling, color space conversion, gray scale conversion, composition, encoding, decoding, etc.

The CPU 117 stores the image data stored in the RAM 118 to the flash ROM 110 or the HDD 111 of the main controller 100 through the bus bridge 116 after the image process applied by the memorized image processing unit 123.

The device interface 120 is an interface between the devices, which are the scanner 105 and the printer 106, and the subcontroller 101. The scanner 105 and the printer 106 exchange signals, such as a control signal, with the CPU 117 via the device interface 120.

The scanner 105 reads an image of an original and acquires image data of the image. The image data read is stored into the RAM 118 through the scanner image processing unit 121. An automatic document feeder may be attached to this scanner 105 in order to read originals automatically.

The printer 106 forms an image on a recording medium like paper with an electrophotographic system or an ink jet system, for example. The CPU 117 stores the image data stored in the flash ROM 110 or the HDD 111 of the main controller 100 to the RAM 118 via the bus bridge 116, and outputs it to the printer 106 via the printer image processing unit 122.

The scanner image processing unit 121 and the printer image processing unit 122 perform image processing, such as color space conversion, movement, color adjustment, concentration control, and delay control. The modem 125 connects to a public line 107, and modulates and restores signals during facsimile transmission and reception.

FIG. 3 is a block diagram schematically showing a functional configuration of the image forming apparatus 201 in the managed object apparatus group 205 shown in FIG. 1.

The image forming apparatus 201 will be described as the representative of the managed object apparatus group 205. The configuration described in FIG. 3 is common to the image forming apparatuses of the managed object apparatus group 205. Moreover, the image forming apparatus 201 supports Unicode.

FIG. 3 shows the function for importing and exporting the setting data. Moreover, an import service requester 301 and a USB storage device 208 are configurations outside the image forming apparatus. Furthermore, an intranet 302 is a part of the network 203. It should be noted that a symbol "DB" used in the following description represents a database. Moreover, a device-setting file that includes address book data, departmental management data, and device-setting data is used as data imported or exported.

A process relevant to the import will be described. First, a network import process that imports data via the network will be described.

The import service requester 301 sends a device setting file, and the import service provider 300 receives a device setting file. The import service requester 301 and the import service provider 300 communicate using an SOAP message via the intranet 302.

After an HTTP server 303 and an SOAP server 304 interpret a request message, a device-setting-import CGI 306 of a network import unit 305 corresponding to a process applicable to the message is started. A network import module 307 executes the process in response to a request.

The SOAP server 304 starts the device-setting-import CGI 306 in accordance with a service request. The device-setting-import CGI 306 started makes the network import module 307 primarily store the received device setting file into a temporary area 320.

The device setting file stored primarily is configured in a compressed format that converged a plurality of XML files. After finishing the primary storing, the network import module 307 requires a secondary storing from a device setting management module 309.

The device setting management module 309 reads the device setting file compressed from the temporary area 320, and performs a decompression process. When the decompression process is successful, a device-setting-file DB 310 is initialized. The above-mentioned temporary area 320 and the device-setting-file DB 310 are stored in the HDD 111.

When the initialization succeeded, an item of the acquired setting item name is registered to the applicable device-setting-file DB 310, while parsing the device setting file acquired by the decompression.

The device setting management module 309 requires tertiary storing from an import module 321 of a setting-value import unit 313 for control. The setting data described in the device setting file becomes effective in an actual device control by this tertiary storing.

The import module 321 that received the request acquires the setting data corresponding to the setting item name of a processing object from the device-setting-file DB 310, and registers it into a setting-management DB 322 for control.

This setting-management DB 322 is stored in the HDD 111, is a DB into which a plurality of sets of setting data containing character string data about the control of the image forming apparatus 201 are registered, and consists of three DBs. As mentioned above, the device setting file includes three kinds of data that are the device setting data, the departmental management-set data, and the address book data. Among these, the device setting data is registered into a device-setting DB 315. The departmental management data is registered into a departmental-management-setting DB 317. The address book data is registered into an address book DB 319.

Accordingly, a device-setting import module 314 reads only device-setting data one-by-one from among a plurality of kinds of setting data contained in the device-setting file, and registers it into the device-setting DB 315.

A departmental-management-setting import module 316 reads only departmental management data from among the plurality of kinds of setting data contained in the device-setting file, and registers it into the departmental-management-setting DB 317.

An address book import module 318 reads only address book data from among the plurality of kinds of setting data contained in the device setting file, and registers it into the address book DB 319.

Next, the import process from the USB storage device 208 will be described. A USB import module 312 performs an import process from the USB storage device 208 instead of the network import unit 305.

The USB import module 312 detects that the device configuration file is stored in the USB storage device 208. The USB import module 312 requires the secondary storing from the device setting management module 309 after storing the device setting file into the temporary area 320. The import operation thereafter this is similar to the network import process.

A process relevant to the export will be described. First, a network export process that exports data via the network will be described.

When receiving an export request via the intranet 302, the import service provider 300 requires the device-setting management module 309 to generate an export file.

When receiving the request to generate the export file, the device-setting management module 309 makes the device-setting-file DB 310 store the information set exported to the import module 321.

When the import module 321 stores the setting data to be exported into the device-setting-file DB 310, the device setting management module 309 generates a device-setting file in the temporary area 320.

This device-setting file describes the setting data that was stored into the device-setting-file DB 310 in XML.

When compressing the device setting file, the device-setting management module 309 notifies an export request source of a completion of generating the device-setting file through the import service provider 300 and the intranet 302.

Then, when the import service provider 300 receives the request of the device-setting file through the intranet 302, the device-setting management module 309 sends the created device setting file to the export request source.

Next, an export process to the USB storage device 208 will be described. When a user requests export to the USB storage, the USB import module 312 require export from the device-setting management module 309.

Thereafter, the process similar to the network export is performed, and the USB import module 312 requires the device-setting file from the device-setting management module 309 when the completion of generating a device setting file is notified.

The USB import module 312 stores the device-setting file received from the device-setting management module 309 into the USB storage device 208. Thus, the device setting file is exported to the USB storage device 208.

Although import and export are controlled by the same module, they may be controlled by different modules.

FIG. 4 is a view showing an example of the setting data read from the device-setting file DB 310 by the device-setting management module 309 shown in FIG. 3.

As shown in FIG. 4, items of the setting data to be read includes "SettingDataName", "KeyName", "Type", "Size", "Value", and "ConversionFlag".

The "SettingDataName" expresses name of setting data. The "KeyName" expresses the setting data name in detail where necessary. The "Type" expresses a data type of the "Value". For example, "string" means a string type and "int" means an integer type. The "Size" expresses a data size of the "Value". Among these, especially the "Value" of the "string" type is character string data.

Moreover, the "ConversionFlag" expresses a conversion flag that is used to determine whether a character string shown in the "Value" should support another character code. That is, it is used to determine whether the character string should be converted. The value "1" of the conversion flag indicates that the character string should be converted into another character code. The value "0" of the conversion flag indicates that the character string is not converted into another character code.

Thus, the "KeyName" is assigned to every setting data. In FIG. 4, two "KeyNames" ("device_name" and "device_name_utf8") are assigned to the setting data of the device name that indicates the name of the image forming apparatus.

Moreover, the "device_name" is a string type and the maximum data size is 16 bytes.

Furthermore, the "device_name_utf8" is the setting data that indicate the same name as the "device_name" in a different character code. In this image forming apparatus, the setting of the character string data of the "device_name_utf8" is effective, and the "device_name" is merely prepared as management information.

Actually, although the "Value" of the "device_name_utf8" is the character string of "X'695243E4b880E58FB7E6A99F'", the "Value" of the "device_name" is blank.

FIG. 5 is a view showing an example of a device setting file generated by the device setting management module 309 shown in FIG. 3.

As shown in FIG. 5, the device setting file is described in XML as mentioned above. Hereinafter, each tag will be described.

First, the tag <lang> indicates the language setting of the image forming apparatus. A code "jp" means Japanese setting. Moreover, the tag <device_settings> indicates a device-setting file.

Furthermore, the tag <device_name_utf8 size="32" type="string"> corresponds to the device name of the "device_name_utf8" in FIG. 4. Moreover, the size is 32 bytes and the type is a character string as well as that shown in FIG. 4. The same size and type as that shown in FIG. 4 are indicated in each of the following tags.

The tag <device_name_size="16" type="string"> corresponds to the device name of the "device_name" in FIG. 4.

The tag <device_location_utf8 size="32" type="string"> corresponds to the device location of the "device_location_utf8" in FIG. 4.

The tag <device_location_size="16" type="string"> corresponds to the device location of the "device_location" in FIG. 4.

The tag <summer_time_settings_size="44" type="binary"> corresponds to the summer time setting in FIG. 4.

The tag <auto_clear_time_size="4" type="int"> corresponds to the auto clear time in FIG. 4.

The tag <fax_receive_mode_size="2" type="u16"> corresponds to the FAX reception mode in FIG. 4.

For example, the setting data of which the "KeyName" is the "device_name_utf8" is the string type data in 32 bytes, is the character string data indicated by the "Value" specified by the "KeyName" as the tag, and has the attributes indicated by the "Size" and "Type".

The above-mentioned device-setting file is an exported file indicating that the file was exported after adding code information that indicates the character code of the character string data concerned to the character string data to be exported. The code information is the "device_name" or "device_name_utf8" that exists in the tag in which the character string is included, when the "Type" is "string". The code information is the second character code in the case of the "device_name", and it is the first character code in the case of the "device_name_utf8".

FIG. 6 is a view showing a language setting of the image forming apparatus 201 shown in FIG. 2.

As shown in FIG. 6, two kinds of character codes are prepared like the first and second character codes for one language. For example, the first character code UTF-8 and the second character code Shift-JIS are prepared for Japanese. Moreover, the first character code is Unicode in any language setting.

Thus, the language settings as shown in FIG. 6 are established in order to support different character codes. However, more than two kinds of character codes may be prepared for one language.

Figure 7:
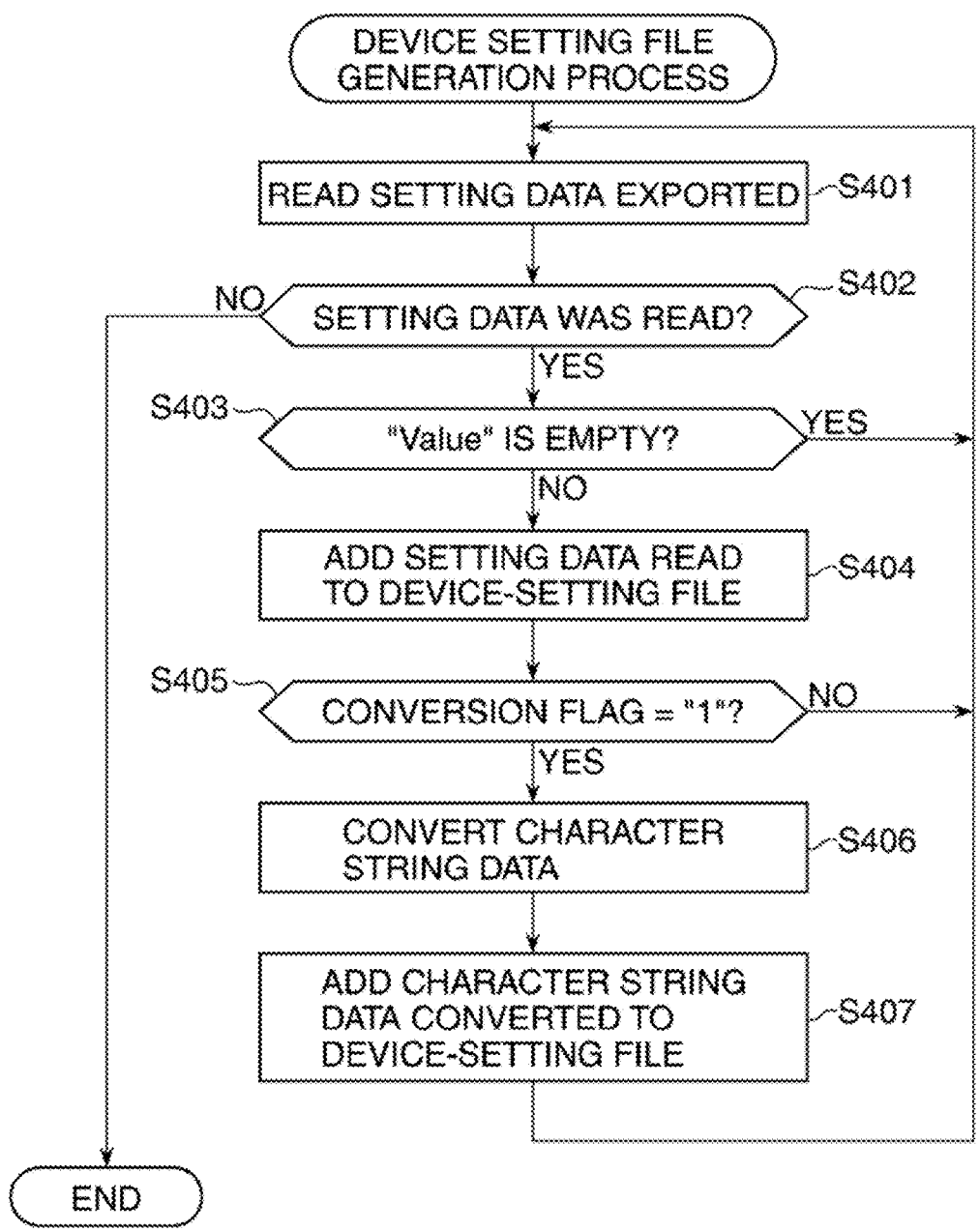
FIG. 7 is a flowchart showing a device setting file generation process executed by a CPU shown in FIG. 2.

FIG. 7 is a flowchart showing a device-setting-file generation process executed by the CPU 108 shown in FIG. 2.

The device-setting-file generation process shown in FIG. 7 is executed at the time of export. The data of the address book DB 319, the departmental-management-setting DB 317, and the device-setting DB 315 is copied to the device-setting-file DB 310 in advance.

Moreover, the tags <?xml version="1.0" encoding="utf-8" ?>, <lang>, and <device_settings> shown in FIG. 5 shall be written into the device-setting file at the time of starting the process.

As shown in FIG. 7, the device-setting management module 309 reads one item of the setting data exported from the device-setting-file DB 310 (step S401). Thus, since the setting data is read one-by-one, the process loops for the number of the items of the setting data (the number of setting values). Moreover, when all the items of the setting data have been read, no data was read in the step S401.

Next, the CPU 108 determines whether any setting data was read (step S402). When no data was read (NO in the step S402), this process is finished. After finishing the process, the device-setting file described in XML will be compressed.

On the other hand, when any setting data was read (YES in the step S402), the CPU 108 determines whether the "Value" is empty (step S403). Empty of the "Value" means that the "Value" is blank like the "Value" of the "device_name" in FIG. 4, for example.

When the "Value" is empty (YES in the step S403), the process returns to the step S401.

On the other hand, when the "Value" is not empty (NO in the step S403), the CPU 108 adds the setting data read to the device-setting file (step S404).

Next, the CPU 108 determines whether the conversion flag is equal to "1" (step S405). When the conversion flag is not equals to "1" (NO in the step S405), the process returns to the step S401.

On the other hand, when the conversion flag is equal to "1" (YES in the step S405), the character code of the character string data is converted (step S406). Then, the character string data of which the character code was converted is added to the device-setting file (step S407), and the process returns to the step S401.

The conversion of the character code in the step S406 will be described. For example, in the case shown in FIG. 4, the CPU 108 will add the setting data indicated by the "device_name" that is the "KeyName" acquired by deleting the suffix "_utf8" from the "device_name_utf8".

Since the "Value" of the "device_name" is empty in this case, the character string data that is acquired by converting the "Value" of the "device_name_utf8" into the second character code is used as the "Value" of the "device_name".

Thus, the process in the step S406 corresponds to the conversion unit. That is, when the character string data in the second character code, which is different from the first character code of the character string data registered in the device-setting-file DB 310, is exported, the character string data is converted into the second character code in the step S406. As a result, the garbling of characters caused by the difference among the character codes is reduced.

More specifically, when the code information indicates the first character code (_utf8) and the conversion flag indicates conversion (YES in the step S405), the character string data is converted into the second character code in the step S406. Moreover, the process in the step S407 corresponds to the export unit. That is, the CPU 108 exports the character string data converted into the second character code in addition to the setting data registered in the device-setting-file DB 310 in the step S407.

The CPU 108 determines the kind of the second character code according to the language setting shown in FIG. 6. In the case shown in FIG. 6, the first character code UTF-8 and the second character code Shift-JIS are prepared for Japanese.

In this case, the character string data "X'695243E4b880E58FB7E6A99F'" in UTF-8 is converted into Shift-JIS to be the character string data "X'69524388EA8D868B40'". The conversion result is shown as an element of the tag <device_name . . . > in FIG. 5.

Such a process is repeated until all the items of the setting data have been read, and the device-setting file is generated in the XML format using the tags of the "KeyName" corresponding to each setting data.

In the device-setting-file generation process shown in FIG. 7, the CPU 108 determines whether the setting data is converted into the second character code in the step S404 for every item of the setting data. However, the CPU 108 determines whether the setting data is converted into the second character code before exporting, based on a user's instruction. That is, it is able to set so as to determine whether the device-setting data is converted or not regardless of the value of the conversion flag.

If the selection result instructs not to convert into the second character code, the process returns to the step S401 without converting the character string data in the step S404 regardless of the value ("0" or "1") of the conversion flag.

Moreover, although the setting data is managed in association with an inherent character string like the "KeyName" in this embodiment, what is necessary is just a unique identifier, and it is not limited to management by a character string like the "KeyName".

Furthermore, although the first character code is UTF-8 and the second character code is Shift-JIS in FIG. 6, the combination of character codes is not necessarily limited to this.

Moreover, the device-setting file may consist of a plurality of files for kinds of the setting data. Moreover, although the device-setting file is generated in the XML format, it may be generated in another format.

Next, an import process will be described. In the embodiment, the device-setting management module 309 initializes the device-setting-file DB 310 before performing the import process. Moreover, if the device-setting file to be imported is compressed, the file is decompressed.

FIG. 8 is a view showing contents of the device-setting-file DB 310 initialized by the device setting management module 309.

As shown in FIG. 8, the "Value" for every setting data is blank, which shows there is no imported data. If the import process is performed, setting data described in a device-setting file is registered into this initialized device-setting-file DB 310.

Figure 9:
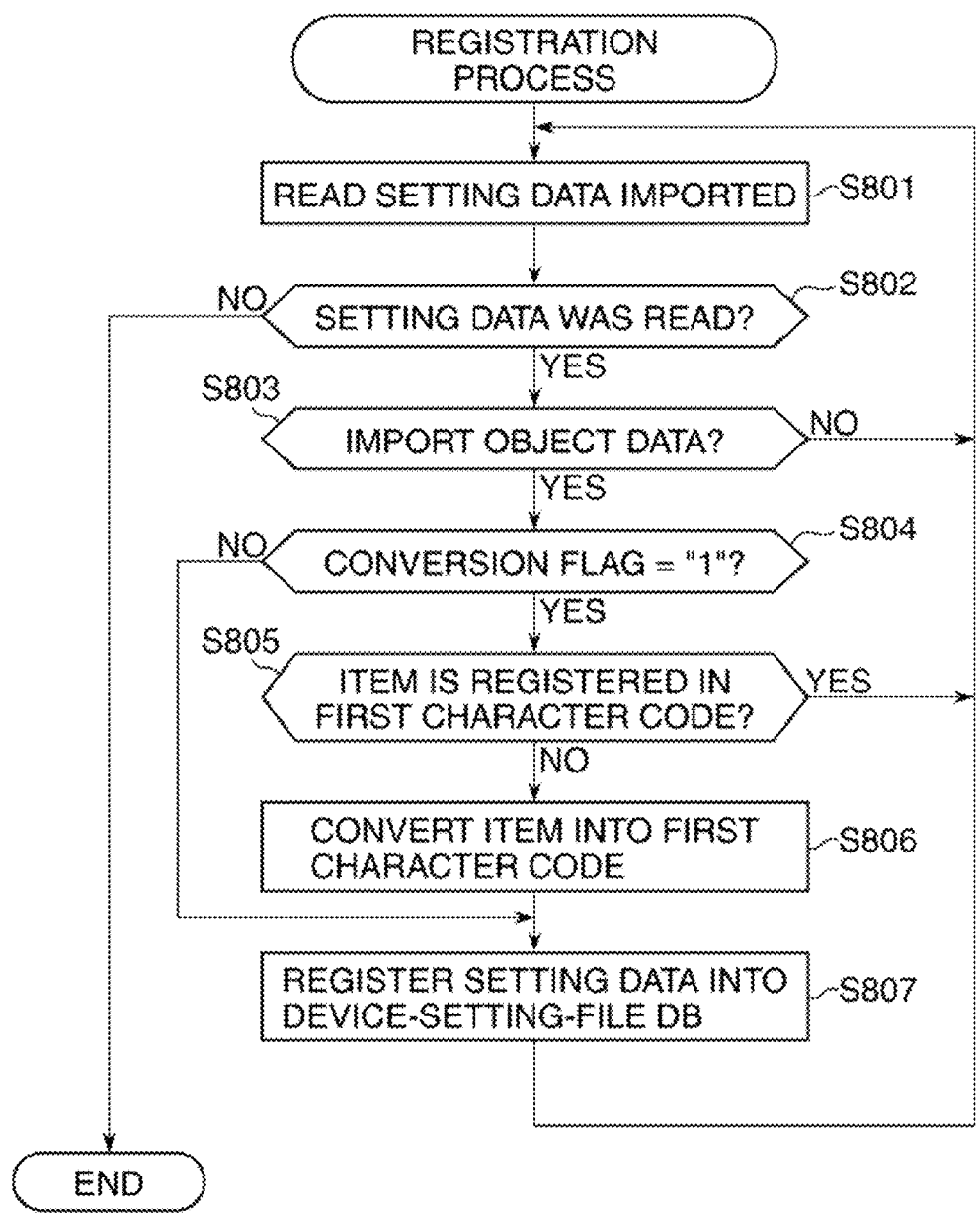
FIG. 9 is a flowchart showing procedures of a registration process executed by the CPU shown in FIG. 2 to register a device setting file to the device setting file DB.

FIG. 9 is a flowchart showing procedures of a registration process executed by the CPU 108 shown in FIG. 2 to register a device setting file to the device-setting-file DB 310. It should be noted that a description of FIG. 9 uses the device-setting file shown in FIG. 10 as an example. As shown in FIG. 10, the code information ("device_name_utf8", "device_name", etc.) that shows the character code of the character string data concerned is added to the character string data to be imported.

As shown in FIG. 9, the CPU 108 parses the device-setting file and analyzes, and reads the setting data to be imported below the tag <device_settings> one-by-one (step S801). Thus, since the setting data is read one-by-one, the process loops for the number of the items of the setting data (the number of setting values). Moreover, when all the items of the setting data have been read, no data was read in the step S801.

Next, the CPU 108 determines whether any setting data was read (step S802). When no setting data was read (NO in the step S802), this process is finished.

On the other hand, when any setting data was read (YES in the step S802), the CPU 108 determines whether the setting data is import object data (step S803). Specifically, when the "KeyName" of the setting data read in the step S801 has been already registered in the device-setting-file DB, the setting data is considered as import object data. For example, since the "summer_time_settings" in the device setting file shown in FIG. 10 has not been registered in the device-setting-file DB shown in FIG. 8, it is not considered as import object data.

Moreover, since the "KeyName" of "device_name_utf8" has been already registered in the device-setting-file DB, it becomes import object data.

When the setting data is not import object data (NO in the step S803), the process returns to the step S801.

On the other hand, when the setting data is import object data (YES in the step S803), the CPU 108 determines whether the item of the setting data is an item in the second character code (step S804). For example, the item of which the "Key-Name" in FIG. 8 does not include "utf8" and of which the conversion flag is "1" is determined as an item in the second character code.

When the item of the setting data is not an item in the second character code (NO in the step S804), the CPU 108 registers the setting data into the device-setting-file DB 310 (step S807), and returns the process to the step S801.

On the other hand, when the item of the setting data is an item in the second character code (YES in the step S804), the CPU 108 determines whether the data of the item concerned has been already registered in the corresponding item in the first character code (step S805).

Specifically, the CPU 108 determines whether the "Value" of the "KeyName" to which "_utf8" is added behind the "KeyName" is empty. For example, the CPU 108 determines whether the data has been already registered in the first character code into the item "device_location_utf8" corresponding to the item "device_location". When the "Value" is not empty, the CPU 108 determines that the data has been already registered in the first character code.

When the data has been already registered in the first character code (YES in the step S805), the process returns to the step S801.

On the other hand, when the data has not been registered in the first character code (NO in the step S805), the CPU 108 converts the setting data into the first character code (step S806). For example, the setting data "X'33328EC08CB18EBA'" of the item <device_location> is converted into the first character code. The process in the step S806 corresponds to the conversion unit. That is, when the character code of the character string data of the setting data that should be imported into the device-setting-file DB 310 is the second character code, which is different from the first character code that is the character code of the character string data registered into the device-setting-file DB 310, the CPU 108 converts the character string data into the first character code in the step S805. As a result, the garbling of characters caused by the difference among the character codes is reduced.

More specifically, when the code information about the character string data to be imported is the second character code (YES in the step S804) and when the character string data converted into the first character code has not been imported (NO in the step S805), the CPU 108 converts the character string data into the first character code.

Next, the CPU 108 registers the setting data converted into the first character code into the device-setting-file DB 310 (step S807), and returns the process to the step S801. For example, the CPU 108 registers the setting data "X'3332E5AE9FE9A893E5AEA4'" of the item <device_location> that was acquired by converting the setting data "X'33328EC08CB18EBA'" into the first character code. The process in the step S407 corresponds to the import unit. That is, the CPU 108 performs the import by registering the converted character string data in place of the character string data in the second character code into the device-setting-file DB 310.

It should be noted that the second character code (Shift-JIS) is converted into the first character code (UTF-8) based on Japanese (jp) setting defined by the tag <lang> in FIG. 10 with reference to the language setting shown in FIG. 6.

Moreover, although the CPU 108 determines that the data is the second character code data because the "KeyName" includes the "utf8" and the conversion flag is "1" in the step S804, any other information may be used as long as the attribute of the item can be determined based on the information concerned.

FIG. 11 is a view showing contents of the device-setting-file DB 310 after the registration process shown in FIG. 10.

As shown in FIG. 11, the "Value" of the item "device_name" and the "Value" of the item "device_location" are empty, because the result in the step S804 is YES (the conversion flag is "1") and the data is not registered in the second character code in the step S807. Since the data for the items "device_name_utf8" and "device_location_utf8" are converted into the first character code in the step S806 and are registered in the first character code in the step S807, the "Values" therefor are not empty.

When the registration to the device-setting-file DB 310 finishes according to the registration process in FIG. 10, the import module 321 reflects the contents of the device-setting-file DB 310 to the setting-management DB 322.

FIG. 12A is a view showing a screen before import displayed on the LCD panel 104 shown in FIG. 2. FIG. 12B is a view showing a screen after the import displayed on the LCD panel 104 shown in FIG. 2.

Moreover, columns for "DEVICE NAME" and "LOCATION" in each screen correspond to the "device_name_utf8" and the "device_location_utf8", respectively.

Although the columns for "DEVICE NAME" and "LOCATION" are blank in FIG. 12A, the imported character strings are displayed in the columns in FIG. 12B.

FIG. 13A is a view showing contents of the device-setting-file DB 310 before registering the contents of the device setting file shown in FIG. 10 into an image forming apparatus that employs a different character code. FIG. 13B is a view showing contents of the device-setting-file DB 310 after registering the contents of the device setting file shown in FIG. 10 into the image forming apparatus that employs the different character code.

As shown in FIG. 13A, the setting data names do not include items "device_name_utf8" and "device_location_utf8", and all the conversion flags are "0".

In this case, the determination result in the step S804 is NO for every item, only the setting data of items of which "Key-Names" are common in FIG. 10 and FIG. 13A are registered into the device-setting-file DB 310 without converting the character code.

As a result, as shown in FIG. 13B, the character strings are registered as the "Values" for the items "device_name" and "device_location" in the second character code as-is.

Although the import and export of the partial setting data in the image forming apparatus were described in the above-mentioned embodiment, the embodiment is applicable to all the setting data in an image forming apparatus.

OTHER EMBODIMENTS

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-120583, filed on May 28, 2012, which is hereby incorporated by reference herein in its entirety.

What is claimed is:

1. A data processing apparatus comprising:
a storage unit configured to store setting data for the data processing apparatus;
a receiving unit configured to receive an instruction for exporting the setting data stored in said storage unit;
a converting unit configured to convert Unicode data included in the setting data into character code data of language, which is set to the data processing apparatus; and
an export unit configured to export the character code data converted by said converting unit and the Unicode data.

2. The data processing apparatus according to claim 1, wherein said export unit exports the setting data and code information that shows the character code of the setting data concerned.

3. The data processing apparatus according to claim 2, wherein code information about the setting data and a conversion flag that shows whether the character code data should be converted by said converting unit are registered in said storage unit for every setting data registered, and
wherein said conversion unit converts the Unicode data when the code information shows Unicode and the conversion flag shows to convert.

4. The data processing apparatus according to claim 3, wherein said converting unit determines whether the setting data is converted into the character code data, based on a user's instruction.

5. A control method for a data processing apparatus comprising:
storing setting data for the data processing apparatus;
receiving an instruction for exporting the stored setting data;
converting Unicode data included in the setting data into character code data of language, which is set to the data processing apparatus; and
exporting the character code data converted in said converting and the Unicode data.

6. A non-transitory computer-readable storage medium storing a computer-readable program and the program computer executable codes to perform a control method for a data processing apparatus, the control method comprising:
storing setting data for the data processing apparatus;
receiving an instruction for exporting the stored setting data;
converting Unicode data included in the setting data into character code data of language, which is set to the data processing apparatus; and
exporting the character code data converted in said converting and the Unicode data.

* * * * *